US009935347B2

(12) United States Patent
Spitzner

(10) Patent No.: US 9,935,347 B2
(45) Date of Patent: Apr. 3, 2018

(54) ELECTRONIC CIRCUIT ASSEMBLY HAVING A CARRIER WITH HOLES THEREIN FOR RECEIVING AND CONNECTING WAVEGUIDES HAVING DIFFERENT DIELECTRIC CONSTANTS

(71) Applicant: L-3 Communications Corporation, New York, NY (US)

(72) Inventor: Matthew J. Spitzner, Lowry Crossing, TX (US)

(73) Assignee: L-3 Communications Corporation, New York, NY (US)

( * ) Notice: Subject to any disclaimer, the term of this patent is extended or adjusted under 35 U.S.C. 154(b) by 65 days.

(21) Appl. No.: 14/948,949

(22) Filed: Nov. 23, 2015

(65) Prior Publication Data
US 2017/0149114 A1    May 25, 2017

(51) Int. Cl.
*H01P 1/04*    (2006.01)
*H01P 5/18*    (2006.01)
*H05K 1/18*    (2006.01)

(52) U.S. Cl.
CPC .............. *H01P 1/042* (2013.01); *H01P 5/188* (2013.01); *H05K 1/182* (2013.01)

(58) Field of Classification Search
CPC ................................ H01P 1/042; H01P 5/087
USPC .................................................. 333/254, 255
See application file for complete search history.

(56) References Cited

U.S. PATENT DOCUMENTS 5,604,469 A * 2/1997 Ishikawa et al. ....... G01S 7/032
331/96
5,917,232 A * 6/1999 Tanizaki et al. .......... H01P 1/04
257/664

* cited by examiner

*Primary Examiner* — Benny Lee
(74) *Attorney, Agent, or Firm* — Egan Peterman Enders Huston

(57) ABSTRACT

An electronic circuit assembly comprising: i) a circuit card assembly (CCA) having circuits integrated on a circuit surface; ii) a housing having an upper surface and a lower surface disposed on the CCA circuit surface, the housing comprising a via extending from the lower surface to the upper surface; and iii) a waveguide assembly disposed in the via. The waveguide assembly comprises: a) a first waveguide having a first dielectric value, a contact end of the first waveguide configured to make contact with the CCA circuit surface; b) a second waveguide having a second dielectric value, wherein the first dielectric value is greater than the second dielectric value; and c) a carrier for holding the first waveguide in contact with the second waveguide. The electronic circuit assembly further comprises: iv) a wave washer disposed in the via on a support surface of the carrier; and v) a third waveguide having a third dielectric value that is less than the second dielectric value. The third waveguide is disposed in the via between an end of the second waveguide and the upper surface of the housing. The wave washer presses apart the third waveguide and the waveguide assembly such that the contact end of the first waveguide is pressed into contact with the CCA circuit surface and the third waveguide is pressed into contact with an external circuit disposed above the housing.

8 Claims, 5 Drawing Sheets

US 9,935,347 B2

ELECTRONIC CIRCUIT ASSEMBLY HAVING A CARRIER WITH HOLES THEREIN FOR RECEIVING AND CONNECTING WAVEGUIDES HAVING DIFFERENT DIELECTRIC CONSTANTS

TECHNICAL FIELD

This application relates to radio frequency waveguides and, more specifically, to a self-adjusting waveguide that compensates for out-of-flatness conditions in a circuit card assembly.

BACKGROUND

Waveguides are well-known circuit components that enable a signal to propagate with minimal loss of energy. The most common are conductive metal tubes that carry high frequency radio waves, such as microwaves. However, the miniaturization of electronic components presents unique problems in implementing waveguides on a very dense circuit card assembly (CCA). The high component density and high level of integration leave very little available board area to integrate traditional waveguides or patch launches, which results in the use of dielectrically loaded waveguides to reduce size.

In order to reduce size, a high dielectrically loaded waveguide may be used with several steps to transition to free space. Using a high dielectric constant value allows the waveguide size to be miniaturized, but also makes the waveguide highly sensitive to physical gaps in the stack up due to the impedance transition from the CCA to the waveguide. Due to the high number of contact points and large surface area, the relative flatness (or lack of flatness) of the CCA becomes a cause for concern in assuring good waveguide-to-CCA contact across the entire surface. Therefore, there is a need for improved methods of implementing a waveguide on a circuit card assembly (CCA).

SUMMARY OF THE INVENTION

To address the above-discussed deficiencies of the prior art, it is a primary object to provide an electronic circuit assembly comprising: i) a circuit card assembly having circuits integrated on a circuit surface thereof; ii) a housing having an upper surface and a lower surface, the lower surface disposed on the circuit surface of the circuit card assembly, the housing comprising a via extending from the lower surface to the upper surface; and iii) a waveguide assembly disposed in the via. The waveguide assembly comprises: a) a first waveguide having a first dielectric constant value, a contact end of the first waveguide configured to make contact with the circuit surface of the circuit card assembly; b) a second waveguide having a second dielectric constant value, wherein the first dielectric constant value is greater than the second dielectric constant value; and c) a carrier for holding the first waveguide in contact with the second waveguide. The electronic circuit assembly further comprises: iv) a wave washer disposed in the via on a support surface of the carrier; and v) a third waveguide having a third dielectric constant value, wherein the second dielectric constant value is greater than the third dielectric constant value, and wherein the third waveguide is disposed in the via between an end of the second waveguide and the upper surface of the housing.

In one embodiment, the carrier is metallic.

In another embodiment, the wave washer acts to press apart the third waveguide and the waveguide assembly such that the contact end of the first waveguide is pressed into contact with the circuit surface of the circuit card assembly.

In still another embodiment, a first surface of the carrier comprises a recess in which the second waveguide is positioned and wherein a portion of the carrier forms a hole that extends from the recess to a second surface of the carrier, wherein the first waveguide is inserted into the hole in order to make contact with the second waveguide positioned in the recess.

In yet another embodiment, the first waveguide and the second waveguide are bonded to the carrier.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged waveguide.

The present disclosure is directed to a self-adjusting waveguide that is a dielectrically loaded multistep waveguide that incorporates a lower free sliding assembly and an upper fixed dielectric. A wave washer is placed between the fixed dielectric and the lower assembly to allow the lower assembly to adjust to variations in the contact height arising from out-of-flatness conditions in a circuit card assembly (CCA) in which the waveguide is implemented.

Figure 1:
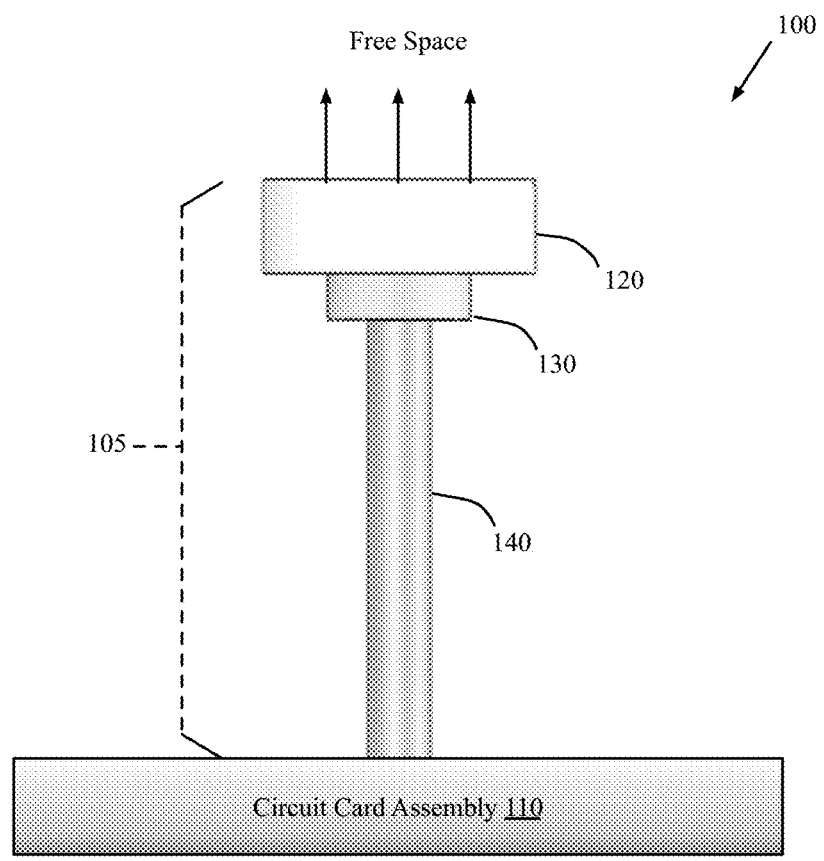
FIG. 1 illustrates a multistep waveguide assembly according to the prior art.

FIG. 1 illustrates a prior art electrical apparatus 100, which comprises multistep waveguide assembly 105 implemented on circuit card assembly (CCA) 110 according to the prior art. Normally, waveguide assembly 105 would be encased in a housing and metallic carrier on top of CCA 110. However, for clarity, the housing and the carrier are omitted in FIG. 1.

Waveguide assembly 105 comprises low dielectric constant value loaded waveguide 120, middle dielectric constant value loaded waveguide 130, and high dielectric constant value loaded waveguide 140. By way of example, low dielectric constant value loaded waveguide 120 may be made of plastic or polymer and middle dielectric constant value loaded waveguide 130 and high dielectric constant value loaded waveguide 140 may be made of ceramic. Waveguide assembly 105 provides impedance matching between free space and CCA 110 to avoid reflections of the propagated wave.

Using a high dielectric constant value load waveguide with several steps in the transition to free space reduces size. However, although the waveguide size is miniaturized, the waveguide becomes highly sensitive to physical gaps in the dielectric stack due to the impedance transition from the CCA to the waveguide. The improved waveguide disclosed herein overcomes the problems in the prior art by creating a dielectric assembly that is free to slide in the housing. The high and middle dielectric constant value pieces are bonded to a metallic carrier, which is cured under compression to minimize the thickness of the glue joint between the dielectrics.

In the prior art, the electrical boundary is defined by the housing. Since the passage though the housing needed to be enlarged to allow the free sliding motion of the dielectric assembly, there was an air gap and diameter change introduced by the waveguide. To overcome this, the high and middle dielectric constant value pieces were metalized. This metal layer defines a consistent electrical boundary despite any motion or gaps between the housing and the dielectric assembly.

Figure 2A:
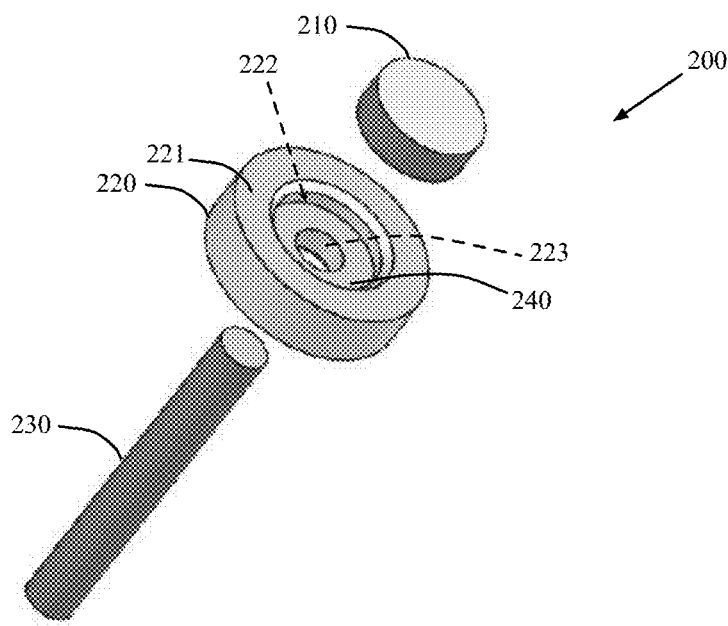
FIG. 2A illustrates an exploded view of a multistep waveguide assembly according to an exemplary embodiment of the present disclosure.
Figure 2B:
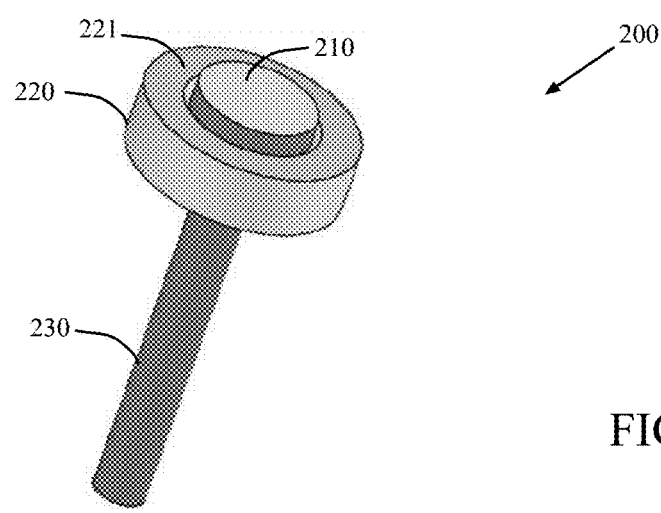
FIG. 2B illustrates a perspective view of a multistep waveguide assembly according to an exemplary embodiment of the present disclosure.

FIG. 2A illustrates an exploded view of multistep waveguide assembly 200 according to an exemplary embodiment of the present disclosure. FIG. 2B illustrates a perspective view of a multistep waveguide assembly 200 according to an exemplary embodiment of the present disclosure. Multistep waveguide assembly 200 comprises middle dielectric constant value loaded waveguide 210, metallic carrier 220, and high dielectric constant value loaded waveguide 230. The exterior surfaces of middle dielectric constant value loaded waveguide 210 and high dielectric constant value loaded waveguide 230 are metalized boundaries.

In FIG. 2A, upper surface 221 of metallic carrier 220 includes recess 222 (indicated by dotted line arrow) into which high dielectric constant value loaded waveguide 230 is inserted. Hole 223 (indicated by dotted line) is bored through the bottom of metallic carrier 220 in order to allow high dielectric constant value loaded waveguide to be inserted to make contact with, and bond to, the bottom of middle dielectric constant value loaded waveguide 210. Inner surface 240 of metallic carrier 220 and the inner surface of hole 223 are adhesive areas that are bonded to both middle dielectric constant value loaded waveguide 210 and high dielectric constant value loaded waveguide 230 to create the completed assembly shown in FIG. 2B.

Thus, in the completed multistep waveguide assembly 200 of FIG. 2B, metallic carrier 220 forms a collar around middle dielectric constant value loaded waveguide 210 and high dielectric constant value loaded waveguide 230. Upper surface 221 of metallic carrier 220 may then be used to support a wave washer as described below in FIGS. 3-5 in greater detail. It is noted that the cylindrical shapes of middle dielectric constant value loaded waveguide 210, metallic carrier 220, and high dielectric constant value loaded waveguide 230 is by way of example only and should not be construed to limit the scope of the present disclosure. In alternate embodiments, middle dielectric constant value loaded waveguide 210, metallic carrier 220, and high dielectric constant value loaded waveguide 230 may have a square cross-section, a rectangular cross-section, or another type of cross-section.

Figure 3:
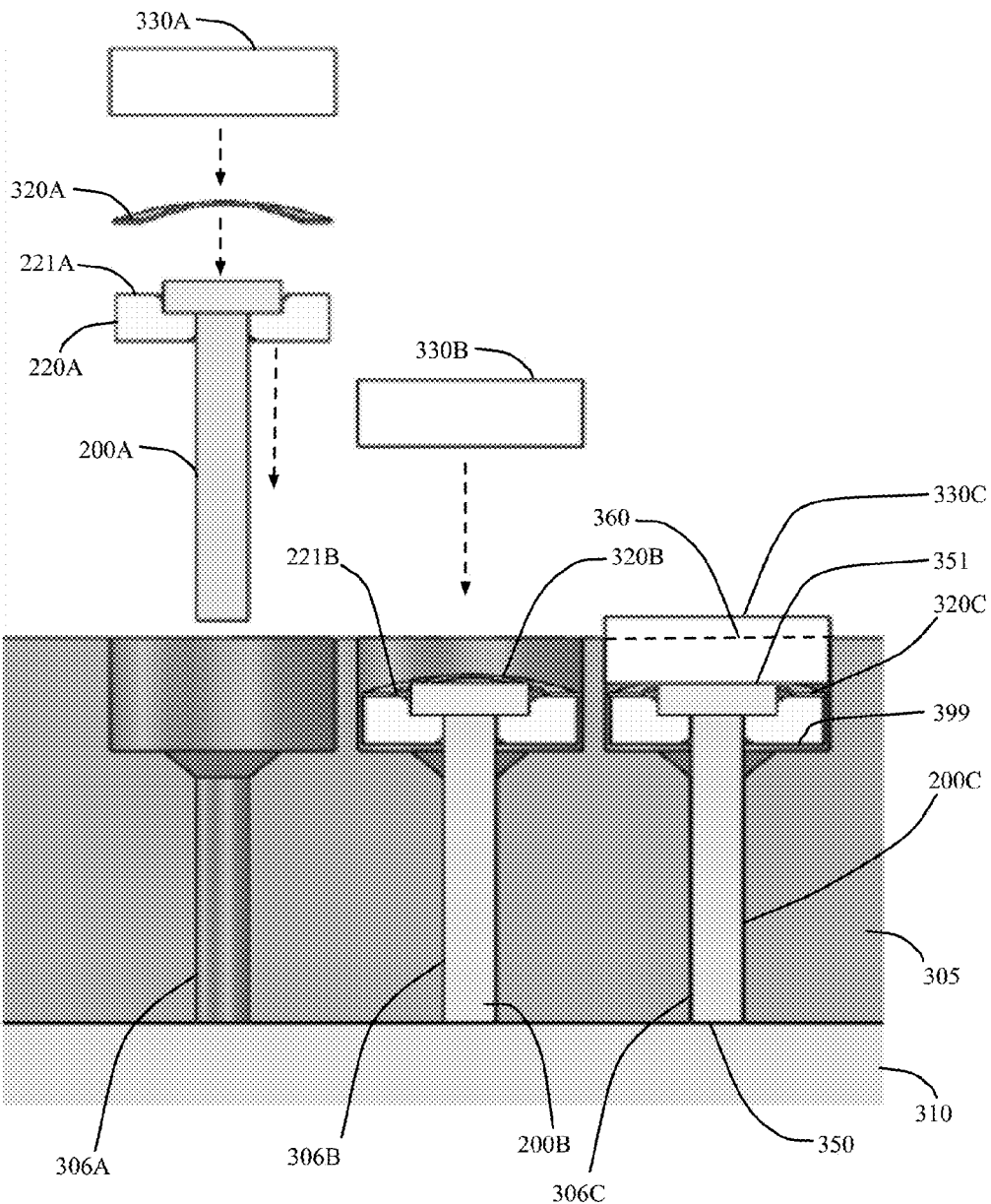
FIG. 3 illustrates a plurality of multistep waveguide assemblies in various states of insertion into a housing according to an exemplary embodiment of the present disclosure.

FIG. 3 illustrates an electronic circuit assembly according to an exemplary embodiment of the present disclosure. The electronic circuit assembly comprises housing 305, which is positioned on flat plane 310, and a plurality of multistep waveguide assemblies 200A, 200B, and 200C in various states of insertion into housing 305. Housing 305 include the shaped vias (of shaped bores) into which one of waveguide assemblies 200A, 200B, or 200C may be inserted. Waveguide assembly 200A, wave washer 320A, and low dielectric constant value loaded waveguide 330A are about to be inserted into shaped via 306A. Waveguide assembly 200B and wave washer 320B are inserted into shaped via 306B, but low dielectric constant value loaded waveguide 330B is not. Waveguide assembly 200C, wave washer 320C, and low dielectric constant value loaded waveguide 330C are inserted into shaped via 306C. Vias 306A -306C are shaped to conform to the profiles of waveguide assemblies 200A-200C, wave washers 320A-320C, and low dielectric constant value loaded waveguides 330A-330C once inserted.

Once each one of dielectric waveguide assembly 200A, dielectric waveguide assembly 200B, and dielectric waveguide assembly 200C is bonded (as shown in FIG. 2B), it is placed in housing 305 with one of wave washer 320A, wave washer 320B, and wave washer 320C on top of metallic carrier 220 (FIGS. 2A and 2B) in each dielectric waveguide assembly 200A, 200B and 200C. By way of example, wave washer 320A is placed on upper surface 221A of metallic carrier 220A of dielectric waveguide assembly 200A. A corresponding upper surface 221B is shown positioned within shaped via 306B..

Housing 305 is placed on top of flat plane 310 during assembly and each dielectric waveguide assembly 200A, 200B and 200C and wave washer 320A, 320B and 320C are captivated by pressing in a respective one of low dielectric constant value loaded waveguide 330A, 330B, or 330C. The low dielectric constant value loaded waveguides 330A, 330B and 330C are slightly larger than the respective vias 306A, 306B and 306C, such that a tight friction grip holds each of the low dielectric constant value loaded waveguides 330A, 330B and 330C rigidly in place in housing 305. This creates zero gap 350 and zero gap 351 on both ends of each dielectric waveguide assembly 200A, 200B and 200C in the fully depressed state. Excess portions of low dielectric constant value loaded waveguide 330C (indicated by dotted line 360) above the upper surface of housing 305 are removed. Vias 306A, 306B, and 306C are sized so that gap 399 provides a built-in clearance at the bottom of the metallic carrier 220 (FIGS. 2A and 2B) of each of waveguide assemblies 200A, 200B and 200C that prevents the metallic carrier 220 of each of waveguide assemblies 200A, 200B and 200C from bottoming (resting) on the inner horizontal surface of vias 306A, 306B and 306C, respectively.

Figure 4:
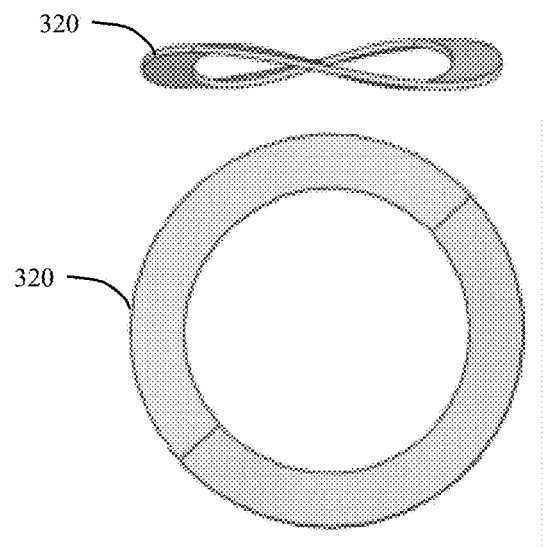
FIG. 4 illustrates a side view and a top view of a wave washer according to an exemplary embodiment of the present disclosure.

FIG. 4 illustrates a side view and a top view of wave washer 320 according to an exemplary embodiment of the present disclosure. The inner diameter of wave washer 320 is large enough to allow a middle dielectric constant value loaded waveguide 210 to fit through the inner diameter when a wave washer 320 is placed on surface 221 of the metallic carrier 220 of each of waveguide assemblies 200A, 200B and 200C. Wave washer 320 is warped or bowed so as not to lie in a flat plane. When the low dielectric constant value loaded waveguide 330 of each respective waveguide assembly 200A, 200B or 200C is placed on top of a respective wave washer 320, the bowing of the respective wave washer 320 presses like a spring against both the metallic carrier 220 and the low dielectric constant value loaded waveguide 330 of the corresponding waveguide assembly 200A, 200B or 200C to try to push the metallic carrier 220 and low dielectric constant value loaded waveguide 330 of the corresponding waveguide assembly 200A, 200B or 200C apart. Since the low dielectric constant value loaded waveguide 330 of each of waveguide assemblies 200A, 200B and 200C is fixed to housing 305 by a tight friction grip within one of vias 306A, 306B or 306C, the net effect of the warped shape of the respective wave washers 320 is that each one of waveguide assemblies 200A, 200B and 200C is pressed downward towards flat plane 310.

Figure 5:
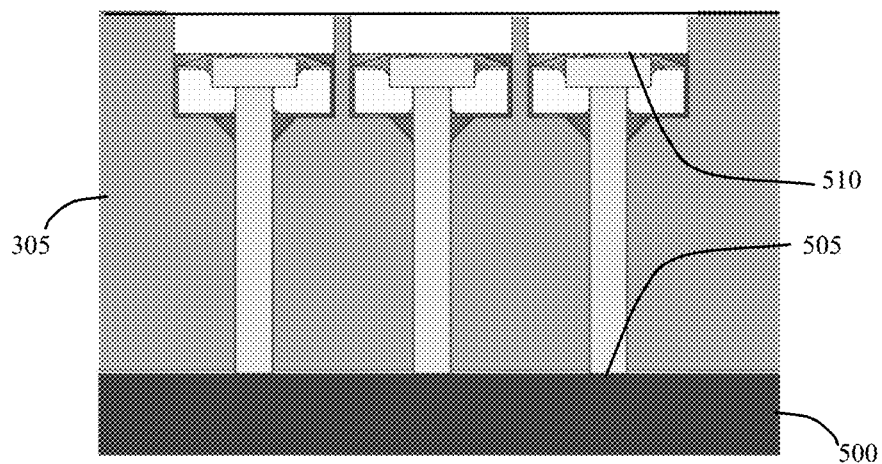
FIG. 5 illustrates a plurality of multistep waveguide assemblies inserted in a housing and mounted on a circuit card assembly (CCA) according to an exemplary embodiment of the present disclosure.

FIG. 5 illustrates an electronic circuit assembly according to an exemplary embodiment of the present disclosure. The electronic circuit assembly comprises housing 305, circuit card assembly (CCA) 500, and a plurality of multistep waveguide assemblies 200A, 200B, and 200C inserted into housing 305. Once housing 305 with the inserted waveguide assemblies 200A, 200B, and 200C is mounted on CCA 500, each of wave washer 320A, wave washer 320B, and wave washer 320C forces one of dielectric assembly 200A, dielectric assembly 200B, and dielectric assembly 200C to adjust to the local flatness conditions and maintain intimate contact with electronic circuits on a circuit surface of CCA 500. The net effect of the warped shape of wave washer 320 is that the contact end (bottom end) of each one of waveguide assemblies 200 is pressed into contact with the circuit surface of CCA 500. Any gap 505 that is adjusted for at the interface between CCA 500 and the contact end (bottom end) of high dielectric constant value loaded waveguide 230 is transferred to gap 510 at the interface between the middle dielectric constant value loaded waveguide 210 and low dielectric constant value loaded waveguide 330, which is a much less sensitive interface.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A waveguide assembly comprising:
a first waveguide having a first dielectric constant value;
a second waveguide having a second dielectric constant value, wherein the first dielectric constant value is greater than the second dielectric constant value; and
a carrier for holding the first waveguide in contact with the second waveguide;
wherein a first surface of the carrier comprises a recess in which the second waveguide is positioned and wherein a portion of the carrier forms a hole that extends from the recess to a second surface of the carrier, wherein the first waveguide is inserted into the hole in order to make contact with the second waveguide positioned in the recess.

2. The waveguide assembly as set forth in claim 1, wherein the carrier is metallic.

3. The waveguide assembly as set forth in claim 1, wherein the first waveguide and the second waveguide are bonded to the carrier.

4. An electronic circuit assembly comprising:
a circuit card assembly having circuits integrated on a circuit surface thereof;
a housing having an upper surface and a lower surface, the lower surface disposed on the circuit surface of the circuit card assembly, the housing comprising a via extending from the lower surface to the upper surface;
a waveguide assembly disposed in the via, the waveguide assembly comprising:
a first waveguide having a first dielectric constant value, a contact end of the first waveguide configured to make contact with the circuit surface of the circuit card assembly;
a second waveguide having a second dielectric constant value, wherein the first dielectric constant value is greater than the second dielectric constant value; and
a carrier for holding the first waveguide in contact with the second waveguide;
a wave washer disposed in the via on a support surface of the carrier; and
a third waveguide having a third dielectric constant value, wherein the second constant dielectric value is greater than the third constant dielectric value, and wherein the third waveguide is disposed in the via between an end of the second waveguide and the upper surface of the housing.

5. The electronic circuit assembly as set forth in claim 4, wherein the carrier is metallic.

6. The electronic circuit assembly as set forth in claim 4, wherein the wave washer acts to press apart the third waveguide and the waveguide assembly such that the contact end of the first waveguide is pressed into contact with the circuit surface of the circuit card assembly.

7. The electronic circuit assembly as set forth in claim 6, wherein a first surface of the carrier comprises a recess in which the second waveguide is positioned and wherein a portion of the carrier forms a hole that extends from the recess to a second surface of the carrier, wherein the first waveguide is inserted into the hole in order to make contact with the second waveguide positioned in the recess.

8. The electronic circuit assembly as set forth in claim 7, wherein the first waveguide and the second waveguide are bonded to the carrier.

* * * * *